US010964598B2

(12) United States Patent
Liu et al.

(10) Patent No.: US 10,964,598 B2
(45) Date of Patent: Mar. 30, 2021

(54) METHODS OF FORMING SOURCE/DRAIN REGIONS OF A FINFET DEVICE AND THE RESULTING STRUCTURES

(71) Applicant: GLOBALFOUNDRIES U.S. Inc., Santa Clara, CA (US)

(72) Inventors: Bingwu Liu, Clifton Park, NY (US); Tao Chu, Portland, OR (US); Man Gu, Malta, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/515,638

(22) Filed: Jul. 18, 2019

(65) Prior Publication Data

US 2021/0020515 A1    Jan. 21, 2021

(51) Int. Cl.
*H01L 21/8234*  (2006.01)
*H01L 29/10*    (2006.01)
*H01L 29/78*    (2006.01)
*H01L 29/06*    (2006.01)
*H01L 29/66*    (2006.01)

(52) U.S. Cl.
CPC ............... *H01L 21/823431* (2013.01); *H01L 21/823412* (2013.01); *H01L 29/0607* (2013.01); *H01L 29/1033* (2013.01); *H01L 29/66795* (2013.01); *H01L 29/785* (2013.01)

(58) Field of Classification Search
CPC ....... H01L 21/823431; H01L 29/66795; H01L 21/823412; H01L 29/0607; H01L 29/785; H01L 29/1033
See application file for complete search history.

(56) References Cited

U.S. PATENT DOCUMENTS

| | | | |
|---|---|---|---|
| 9,570,561 B2 | 2/2017 | Hsiao et al. | |
| 9,875,944 B2 | 1/2018 | Li | |
| 10,074,668 B2 | 9/2018 | Ching et al. | |
| 2014/0095127 A1 | 4/2014 | Weir et al. | |
| 2016/0336429 A1* | 11/2016 | Peng | H01L 29/0649 |
| 2018/0182756 A1* | 6/2018 | Lee | H01L 27/0886 |
| 2018/0190504 A1* | 7/2018 | Lee | H01L 21/31116 |
| 2018/0350625 A1* | 12/2018 | Chao | H01L 29/7848 |
| 2019/0341472 A1* | 11/2019 | Lee | H01L 21/0245 |
| 2020/0119150 A1* | 4/2020 | Lee | H01L 29/66545 |
| 2020/0135574 A1* | 4/2020 | Yang | H01L 21/76224 |
| 2020/0135872 A1* | 4/2020 | Zang | H01L 23/5221 |
| 2020/0243344 A1* | 7/2020 | Lee | H01L 21/31116 |

* cited by examiner

*Primary Examiner* — Victor A Mandala
(74) *Attorney, Agent, or Firm* — Francois Pagette; Hoffman Warnick LLC

(57) ABSTRACT

One illustrative method disclosed herein includes forming at least one fin, forming a first recessed layer of insulating material adjacent the at least one fin and forming epi semiconductor material on the at least one fin. In this example, the method also includes forming a second recessed layer of insulating material above the first recessed layer of insulating material, wherein at least a portion of the epi semiconductor material is positioned above a level of the upper surface of the second recessed layer of insulating material, and forming a source/drain contact structure above the second recessed layer of insulating material, wherein the source/drain contact structure is conductively coupled to the epi semiconductor material.

18 Claims, 15 Drawing Sheets

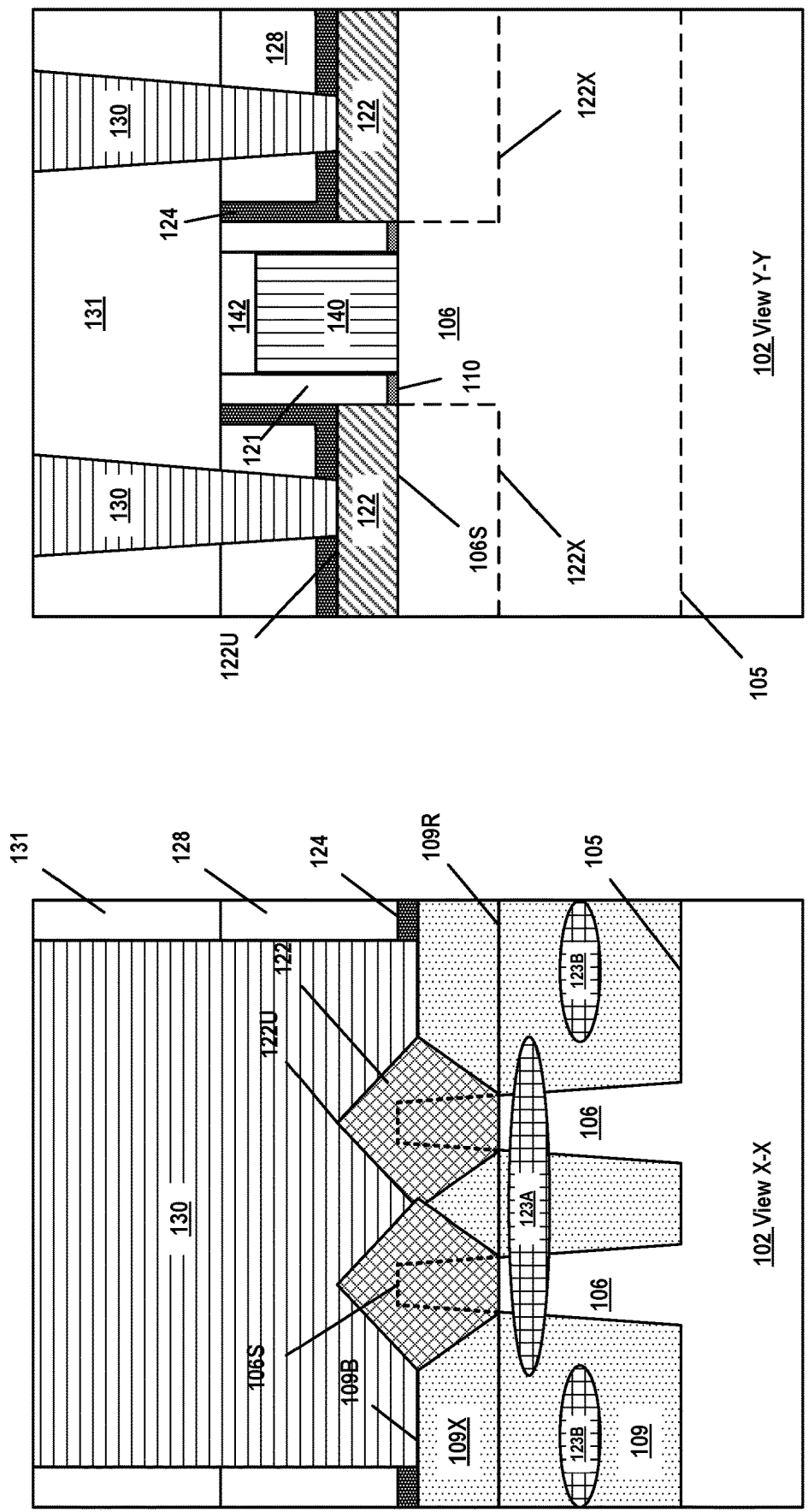

METHODS OF FORMING SOURCE/DRAIN REGIONS OF A FINFET DEVICE AND THE RESULTING STRUCTURES

BACKGROUND

Field of the Invention

The present disclosure generally relates to various methods of forming source/drain regions of a FinFET device and the resulting structures.

Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either N-type (NFET) or P-type (PFET) devices, wherein the "N" and "P" designation is based upon the type of dopants used to create the source/drain regions of the devices. So-called CMOS (Complementary Metal Oxide Semiconductor) technology or products refers to integrated circuit products that are manufactured using both NFET and PFET transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region of the transistor.

A conventional FET is a planar device. To improve the operating speed of planar FETs, and to increase the density of planar FETs on an integrated circuit product, device designers have greatly reduced the physical size of planar FETs over the past decades. More specifically, the channel length of planar FETs has been significantly decreased, which has resulted in improving the switching speed and in lowering operation currents and voltages of planar FETs. However, decreasing the channel length of a planar FET also decreases the distance between the source region and the drain region. In some cases, this decrease in the separation between the source and the drain makes it difficult to efficiently prevent the electrical potential of the source region and the channel from being adversely affected by the electrical potential of the drain. This is sometimes referred to as a so-called short channel effect, wherein the characteristic of the planar FET as an active switch is degraded.

In contrast, a FinFET device is a three-dimensional device that comprises at least one fin that is oriented perpendicular to the base semiconductor substrate, i.e., the fin has a height, a length (in the gate length direction of the device) and a width (in the gate width direction of the device). A FinFET device also includes a gate structure that covers a portion of the axial length of the fin. The portions of the fin covered by the gate structure is the channel region of the FinFET device, while the portions of the fin positioned laterally outside of the gate structure are part of the source/drain regions of the device 10. Traditionally, epi semiconductor material is formed on the portions of the fin positioned in the source/drain regions of the device.

Device designers are under constant pressure to increase the performance of transistor devices as well as increase packing densities in IC products. One area where device designers have focused greater effort is on manufacturing transistors with a specific threshold voltage ($V_t$) that is dependent upon where the transistor will be used in the IC product. In general, all other things being equal, the lower the threshold voltage, the greater the "switching speed" and the greater the off-state leakage currents. These types of devices are sometimes referred to as "low-$V_t$" (LVT) or "ultra-low $V_t$" (ULVT) devices. These LVT and ULVT devices are typically employed in integrated circuits where speed of operation is important, like logic circuits, microprocessors, etc. In contrast, there are other circuits where switching speed is not the dominant concern, e.g., input/output circuits where reducing off-state leakage currents is important. In those types of circuits, transistors may be manufactured with a relatively higher threshold voltage so as to reduce leakage currents with the trade-off being slower switching speeds.

One significant contributor to the failure of a transistor is hot carrier injection. In general, hot carrier injection is an effect where high-energy charges are injected into the gate dielectric of a transistor and may become lodged in the dielectric. Trapped charges tend to accumulate over time and may degrade the threshold voltage, switching characteristics, channel mobility and drain current of transistors, all of which may eventually lead to failure of the device or at least reduced device performance.

The present disclosure is generally directed to various novel methods of forming source/drain regions of a FinFET device, and the resulting structures that may solve or at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel methods of forming source/drain regions of a FinFET device, and the resulting structures. One illustrative method disclosed herein includes forming at least one fin in a semiconductor substrate, forming a first recessed layer of insulating material adjacent the at least one fin and forming epi semiconductor material on the at least one fin. In this example, the method also includes forming a second recessed layer of insulating material above the first recessed layer of insulating material, wherein at least a portion of the epi semiconductor material is positioned above a level of the upper surface of the second recessed layer of insulating material, and forming a source/drain contact structure above the second recessed layer of insulating material, wherein the source/drain contact structure is conductively coupled to the epi semiconductor.

One illustrative FinFET device disclosed herein includes at least one fin, a first recessed layer of insulating material positioned adjacent the at least one fin and an epi semiconductor material positioned on the at least one fin. A second recessed layer of insulating material positioned is on and in contact with a first upper surface of the first recessed layer of insulating material, the second recessed layer of insulating material having a second upper surface, wherein at least a portion, but at most approximately 50%, of the vertical thickness of the epi semiconductor material is positioned above a level of the second upper surface, and a source/drain contact structure positioned above the second recessed layer of insulating material, the source/drain contact structure being conductively coupled to the epi semiconductor material.

BRIEF DESCRIPTION OF THE DRAWINGS

The disclosure may be understood by reference to the following description taken in conjunction with the accompanying drawings, in which like reference numerals identify like elements, and in which:

FIGS. 1-15 depict various novel methods of forming source/drain regions of a FinFET device, and the resulting structures.

Figure 1:
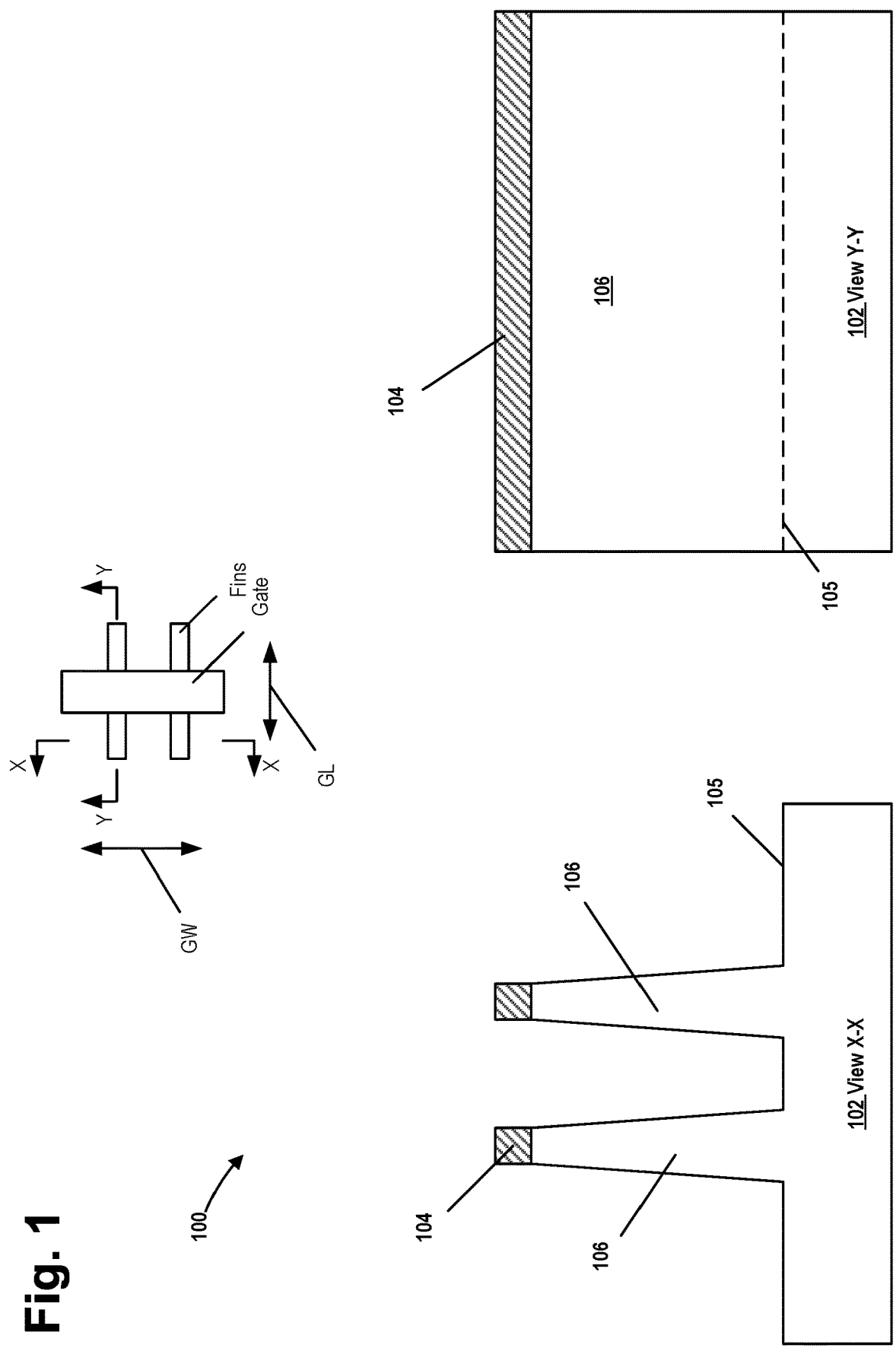

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-15 depict various novel various methods of forming source/drain regions of a FinFET device 100, and the resulting structures and integrated circuit products. As will be appreciated by those skilled in the art after a complete reading of the present application, the FinFET device 100 disclosed herein may be an N-type or P-type device and it may be formed on a bulk semiconductor substrate 102. Additionally, the gate structure of the FinFET device 100 may be manufactured using known gate-first or replacement gate manufacturing techniques. For purposes of disclosure only, the FinFET device 100 described below will be an N-type device that is formed above a bulk semiconductor substrate 102 wherein the gate structure of the FinFET device 100 is formed by performing known replacement gate manufacturing techniques. However, as noted above, the various inventions disclosed herein should not be considered to be limited to the particular examples shown in the attached drawings and described below.

FIG. 1-15 are various views of various embodiments of a FinFET device 100 (comprised of two illustrative fins) that may be formed using the methods disclosed herein. The drawings also include a simplistic plan view of the FinFET device 100 that depicts the location where various cross-sectional views depicted in the following drawings will be taken. More specifically, the view "X-X" is a cross-sectional view taken through a source/drain region of the FinFET device 100 in a direction that is transverse to the long axis of the fins, i.e., in a direction that is substantially parallel to the gate width (GW) direction of the FinFET device 100. The view "Y-Y" is a cross-sectional view that is taken through the long axis of a single fin in a direction that is transverse to the long axis of the gate structure, i.e., in the current transport or gate length (GL) direction of the FinFET device 100.

As noted above, in the examples depicted herein, the FinFET device 100 will be formed in and above a bulk semiconductor substrate 102. The substrate 102 may be made of silicon or it may be made of semiconductor materials other than silicon. Thus, the terms "substrate" or "semiconductor substrate" should be understood to cover all semiconducting materials and all forms of such substrates. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application FIG. 1 depicts the FinFET device 100 at a point in fabrication wherein several process operations have been performed. First, a patterned etch mask 104, e.g., a combination of a silicon dioxide layer (e.g., a pad oxide (not separately shown)) and a silicon nitride layer (e.g., a pad nitride (not separately shown)), was formed above the substrate 102. In some cases, the pad oxide layer may be omitted if desired. Thereafter, one or more etching processes were performed through the patterned etch mask 104 so as to define a plurality of fin-formation trenches 105 in the substrate 102. This etching process results in the formation of a plurality of fins 106 defined from the substrate material 102. The illustrative FinFET device 100 disclosed herein will be depicted as being comprised of two illustrative fins 106. However, as will be recognized by those skilled in the art after a complete reading of the present application, the methods and devices disclosed herein may be employed when manufacturing FinFET devices having only a single fin 106 or any number of fins 106. With respect of view X-X, the fins 106 extend laterally into and out of the drawing page in the current transport (gate length) direction of the FinFET device 100 and into what will become the source/drain regions of the FinFET device 100.

With continuing reference to FIG. 1, the overall size, shape and configuration of the fin-formation trenches 105 and the fins 106 may vary depending on the particular application. The depth and width of the trenches 105 may vary depending upon the particular application. In one illustrative embodiment, based on current day technology, the overall depth (relative to the upper surface of the substrate 102) of the trenches 105 may range around about 100 nm. Thus, the size and configuration of the fin-formation trenches 105 and the fins 106, and the manner in which they are made, should not be considered a limitation of the present invention.

Figure 2:
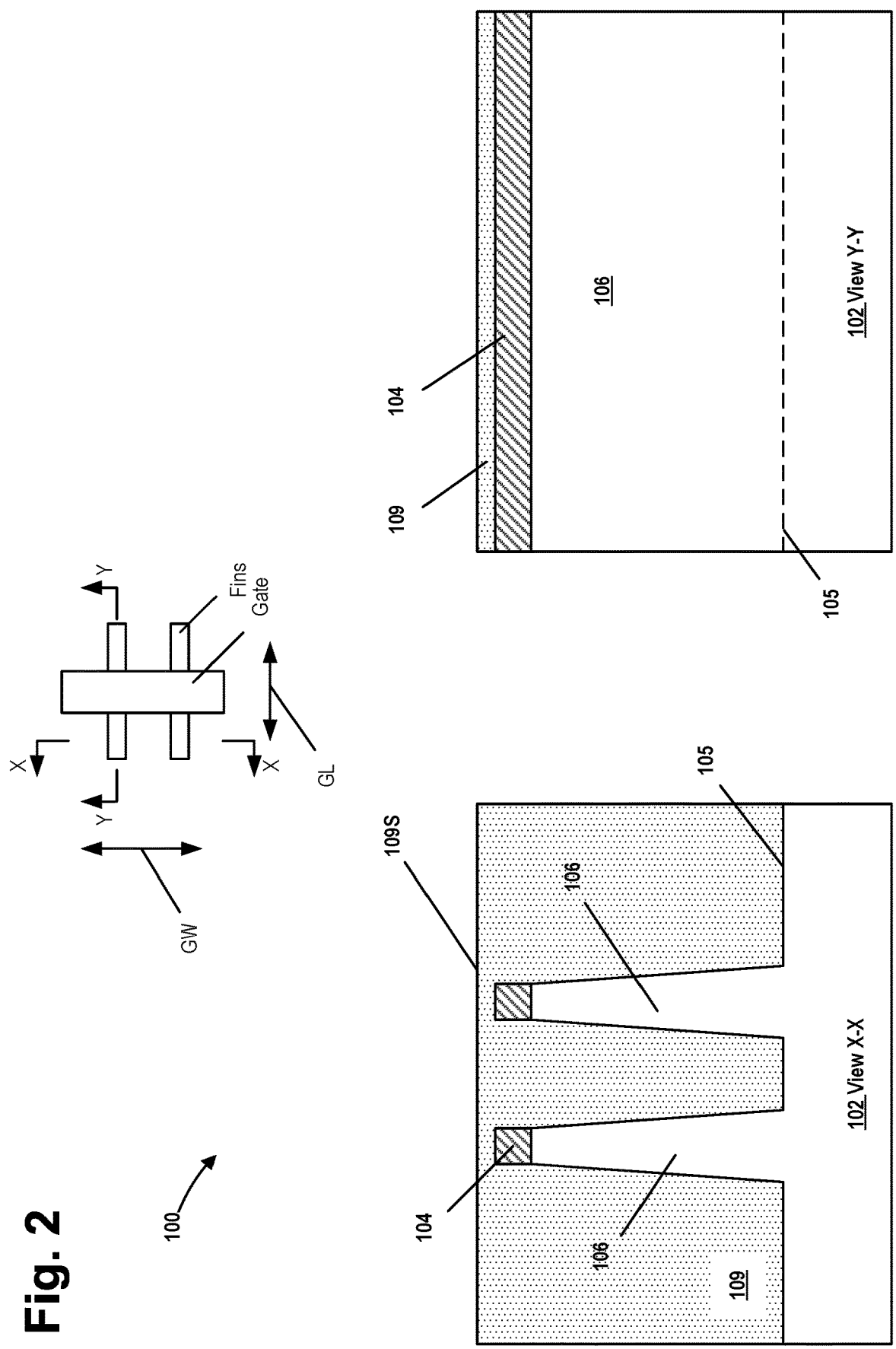

FIG. 2 depicts the FinFET device 100 after a first layer of insulating material 109 was formed so as to over-fill the trenches 105 between the fins 106. That is, the first layer of insulating material 109 was formed such that its upper surface 109S is positioned above the patterned masking layer 104. The first layer of insulating material 109 may be comprised of, for example, silicon dioxide, a HARP oxide, HDP oxide, flowable oxide, etc.

Figure 3:
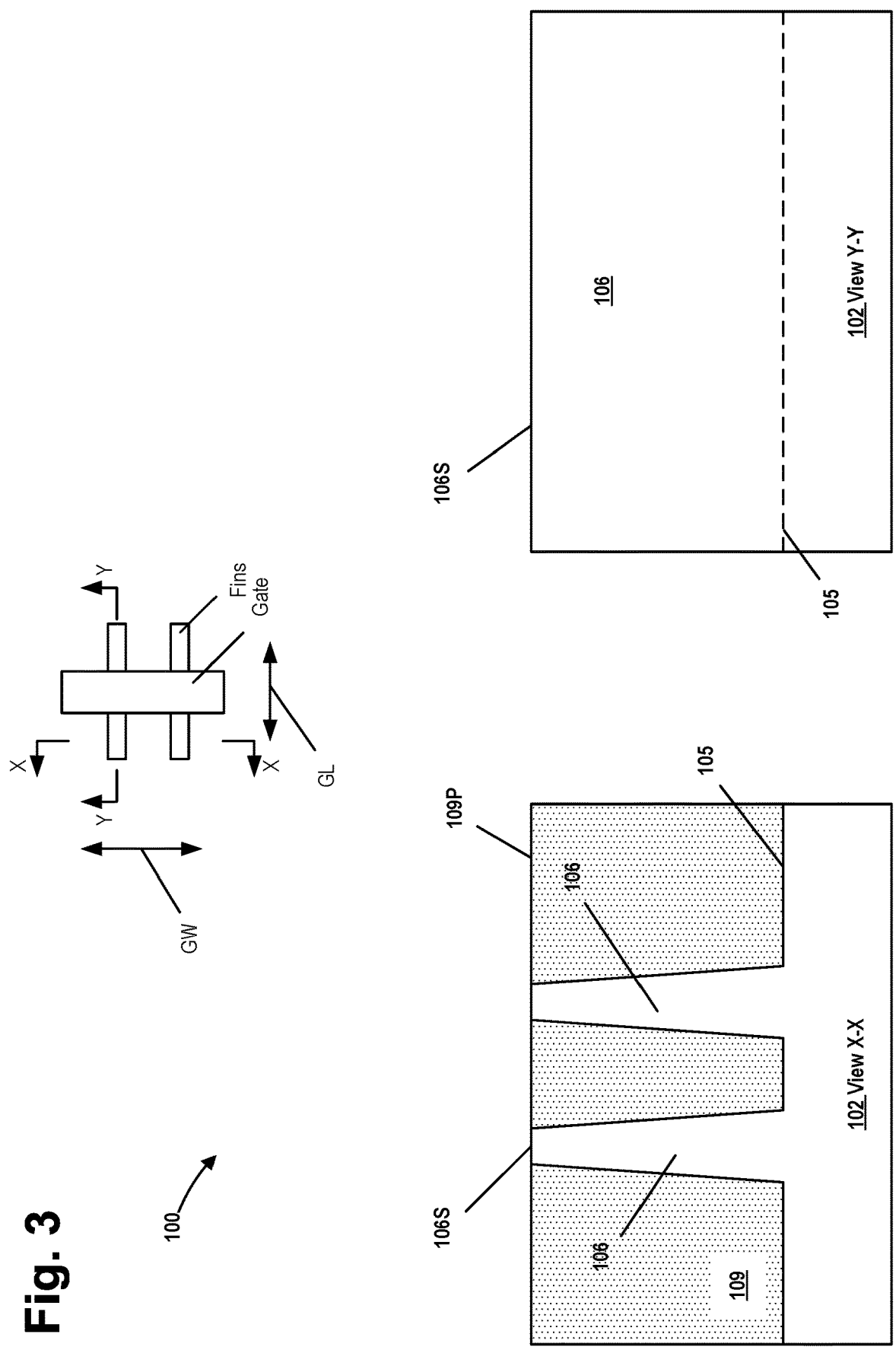

FIG. 3 depicts the FinFET device 100 after one or more planarization processes (e.g., a CMP or etch-back process) was performed to remove portions of the layer of insulating material 109 and the patterned hard mask layer 104. These processes result in the layer of insulating material 109 having a planarized surface 109P and in the exposure of the upper surface 106S of the fins 106.

Figure 4:
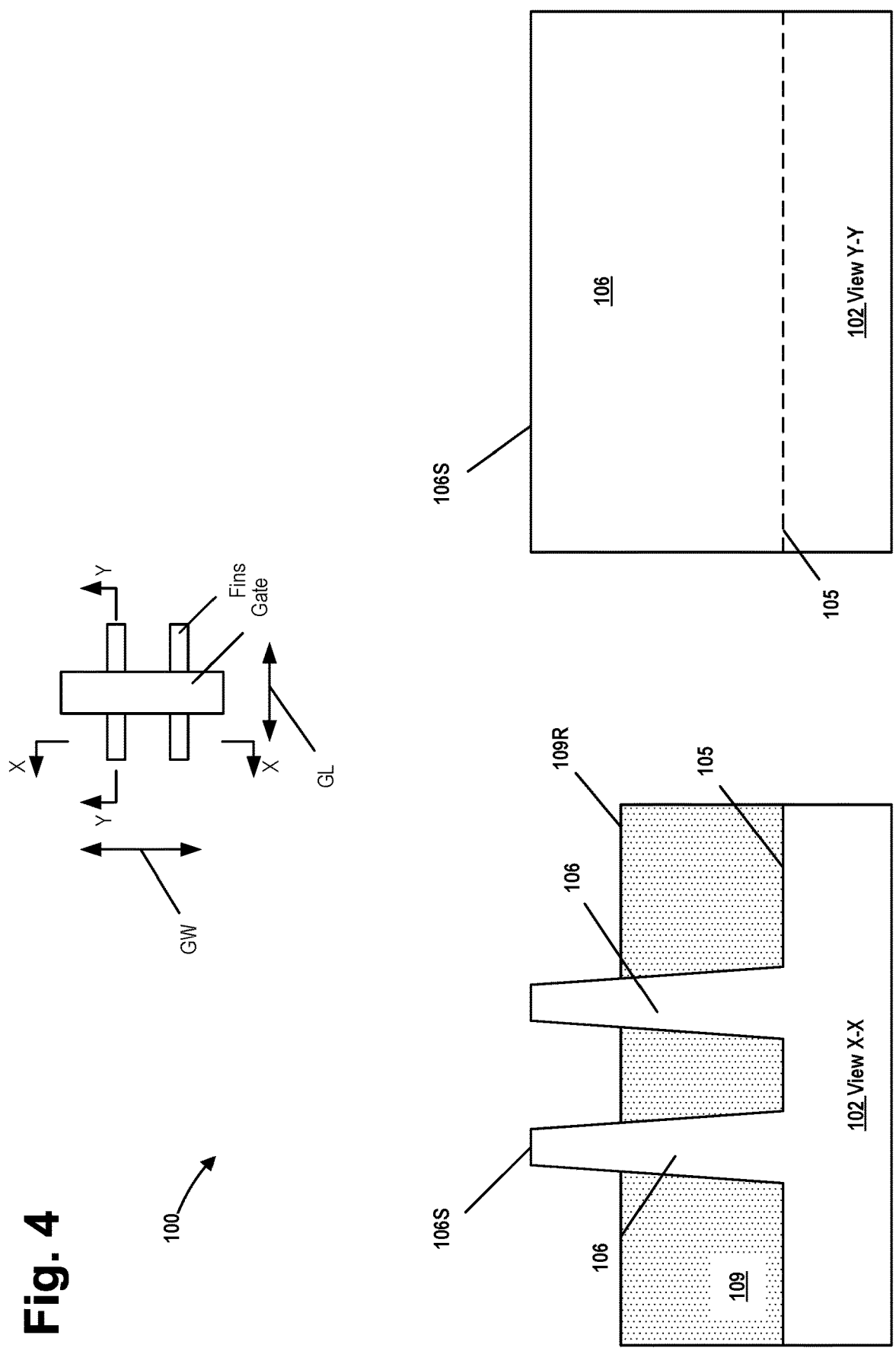

FIG. 4 depicts the FinFET device 100 after a timed, recess etching process was performed to remove a portion of the first layer of insulating material 109. The recess etching process was performed for a sufficient duration such that the first layer of insulating material 109 has a substantially planar recessed upper surface 109R that is positioned at a desired height level within the trenches 105. The amount of recessing of the first layer of insulating material 109 may vary depending upon the particular application. This recess etching process exposes the desired final fin height of the fins 106 for the FinFET device 100. In one illustrative embodiment, based upon current-day technology, the final fin height may be on the order of about 20-60 nm.

Figure 5:
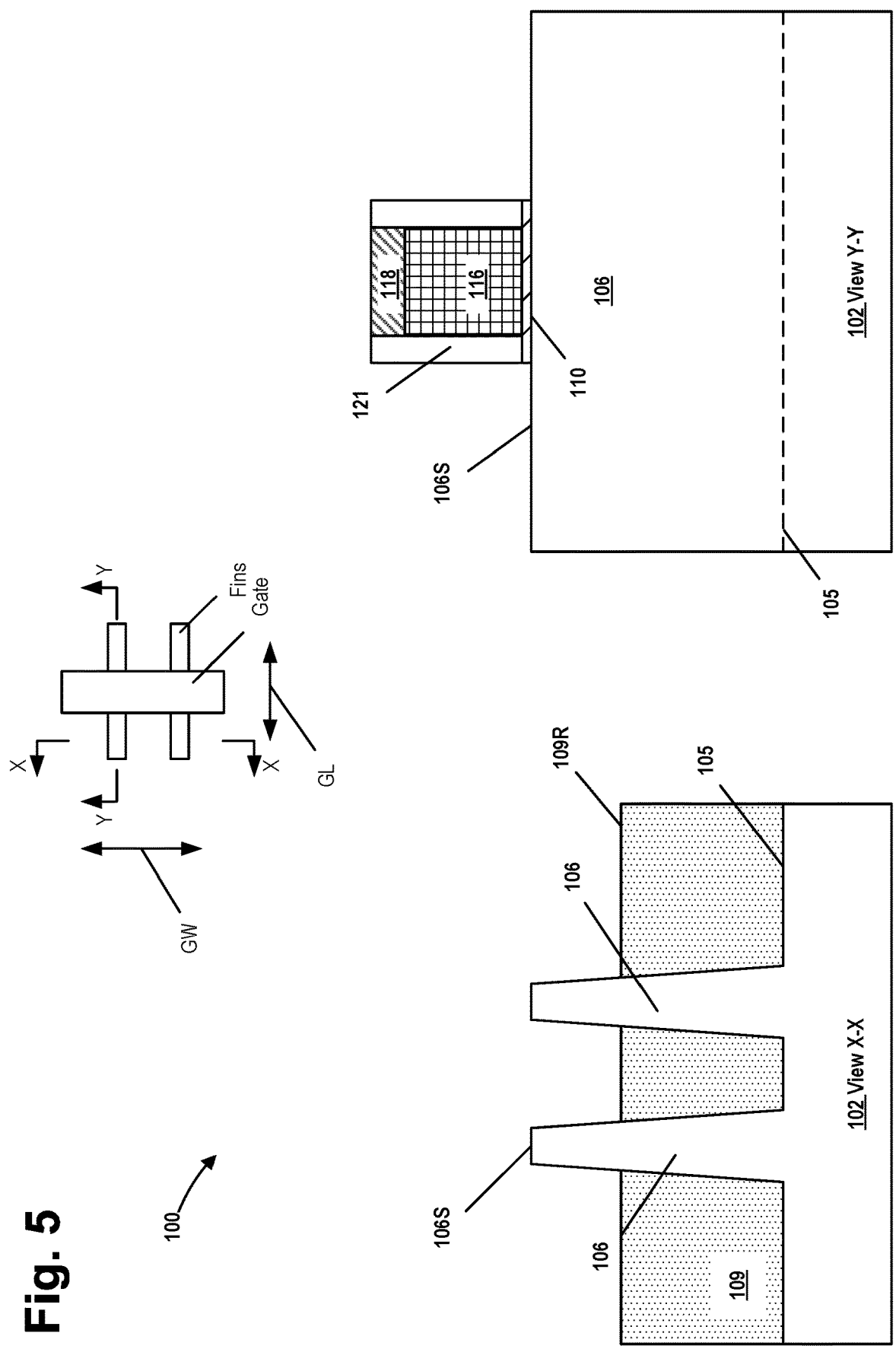

In one illustrative process flow, the next major process operation involves the formation of a gate structure for the FinFET device 100. The methods disclosed herein may be employed in cases where the gate structure is manufactured using any desired technique, e.g., using so-called "gate first" or "replacement gate" manufacturing techniques. By way of illustration only, the gate structure for the FinFET device 100 will be depicted as being formed using a replacement gate process. Accordingly, FIG. 5 depicts the FinFET device 100 after a sacrificial gate insulation layer 110, a sacrificial gate structure 116 and a gate cap (hard mask) layer 118 were formed on the FinFET device 100 and patterned. In one embodiment, the sacrificial gate insulation layer 110 may be a thermally grown layer of silicon dioxide, the sacrificial gate structure 116 may be made of a material such as polysilicon or amorphous silicon, while the gate cap layer 118 may be made of a material such as silicon nitride. The thickness of these materials may vary depending upon the particular application. FIG. 5 depicts the FinFET device 100 after the material of the sacrificial gate structure 116 and the layer of material of the gate cap 118 were patterned using traditional masking and etching techniques. Also shown in FIG. 5 is a simplistically depicted sidewall spacer 121 that was formed adjacent the patterned sacrificial gate structure 116 and the patterned gate cap 118. The sidewall spacer 121 was formed by depositing a layer of spacer material (e.g., silicon nitride, a low-k material, etc.) and thereafter performing an anisotropic etching process. The spacer 121 may be of any desired thickness (as measured at its base). Of course, in some embodiments, more than one spacer may be formed adjacent the sacrificial gate structure 116.

Figure 6:
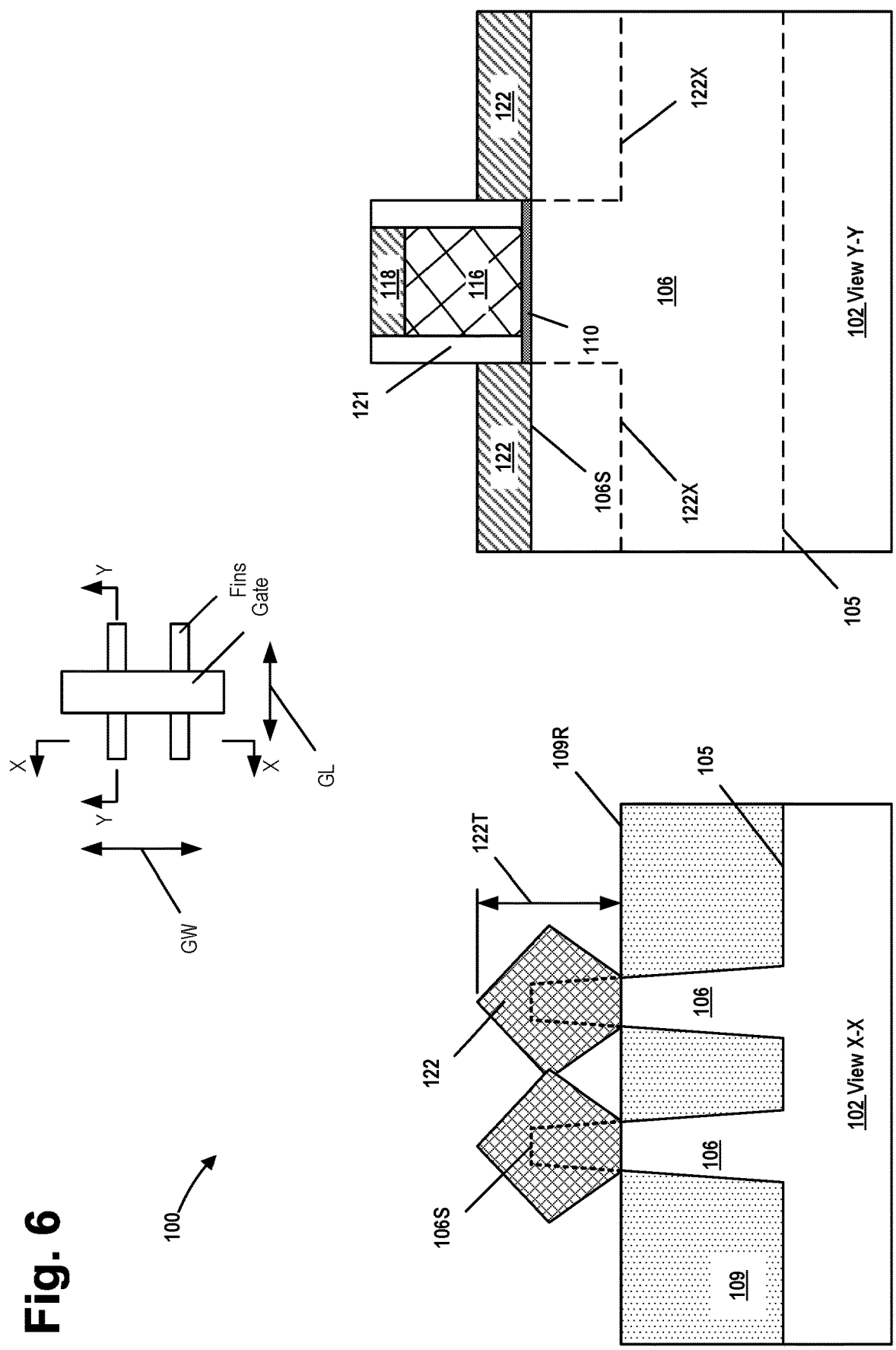

In one illustrative process flow, the next major process operation involves the formation of epi semiconductor material 122 in the source/drain regions of the FinFET device 100. With reference to FIG. 6, in one particularly illustrative process flow, prior to the formation of the epi semiconductor material 122, a plurality of epi cavities, as depicted by the dashed lines 122X in the view Y-Y, may etched into the fins 106. However, the illustrative example depicted herein does not involve the formation of such epi cavities 122X. As shown in FIG. 6, source/drain epi semiconductor material 122 was formed on portions of the fins 106 positioned laterally outside of the spacer 121, i.e., around and above the three sides of the fins 106 that are positioned above the recessed surface 109R of the layer of insulating material 109. For reference purposes only, the outline of the portion of the fins 106 that extends above the recessed surface 109R are depicted in dashed lines.

The source/drain epi semiconductor material 122 may be formed by performing traditional epitaxial semiconductor growth processes. The source/drain epi semiconductor material 122 may be comprised of a variety of different materials and different source/drain epi semiconductor materials 122 may be formed on different type devices, e.g., silicon (Si), silicon germanium (SiGe), etc., for P-type devices, silicon, silicon-carbide (SiC), etc., for N-type devices. In other applications, the source/drain epi semiconductor material 122 may be the same material for both types of devices, e.g., silicon for both the N- and P-type devices. Typically, due to the crystallographic orientation of the material of the fins 106, the epi material 122 will grow in a somewhat diamond-shaped configuration. The epi growth process is a self-limiting process in that there is only a certain amount of epi material 122 that will grow above the upper surface 106S of the fins 106. The physical size or volume of the epi semiconductor material 122 that is formed may vary depending upon the particular application. In one illustrative example, based upon current-day technology, the epi semiconductor material 122 may have a vertical thickness (or height) 122T of about 20-70 nm. In one illustrative process flow, the regions of epi semiconductor material 122 may be doped with a particular type of dopant (N or P) as it is grown, i.e., it may be doped in situ. In other applications, the epi semiconductor material 122 may be initially formed as substantially un-doped epi material and thereafter doped with the appropriate dopant atoms by performing one or more ion implantation processes. In even other applications, even if the epi semiconductor material is initially doped in situ, additional dopant material may be added to the epi semiconductor material 122 by way of ion implantation.

In the example depicted herein, the epi semiconductor material 122 is "merged" in that regions of epi semiconductor material 122 on each of the fins 106 contacts and engages one another. However, the presently disclosed inventions is not to be considered to be limited to situations where epi semiconductor material 122 merges with adjacent regions of epi-semiconductor material 122. That is, in one example, the epi semiconductor material 122 formed in the source/drain regions of the FinFET device 100 may be "un-merged", i.e., the situation where the FinFET device 100 comprises a plurality of fins 106, but the epi semiconductor material 122 formed on each of the fins 106 is completely separate and does not contact the other regions of epi semiconductor material 122 formed on the other fins 106. Of course, in the case of a FinFET device 100 with only a single fin 106, the epi semiconductor material 122 will not be merged with any other epi semiconductor material 122.

Figure 7:
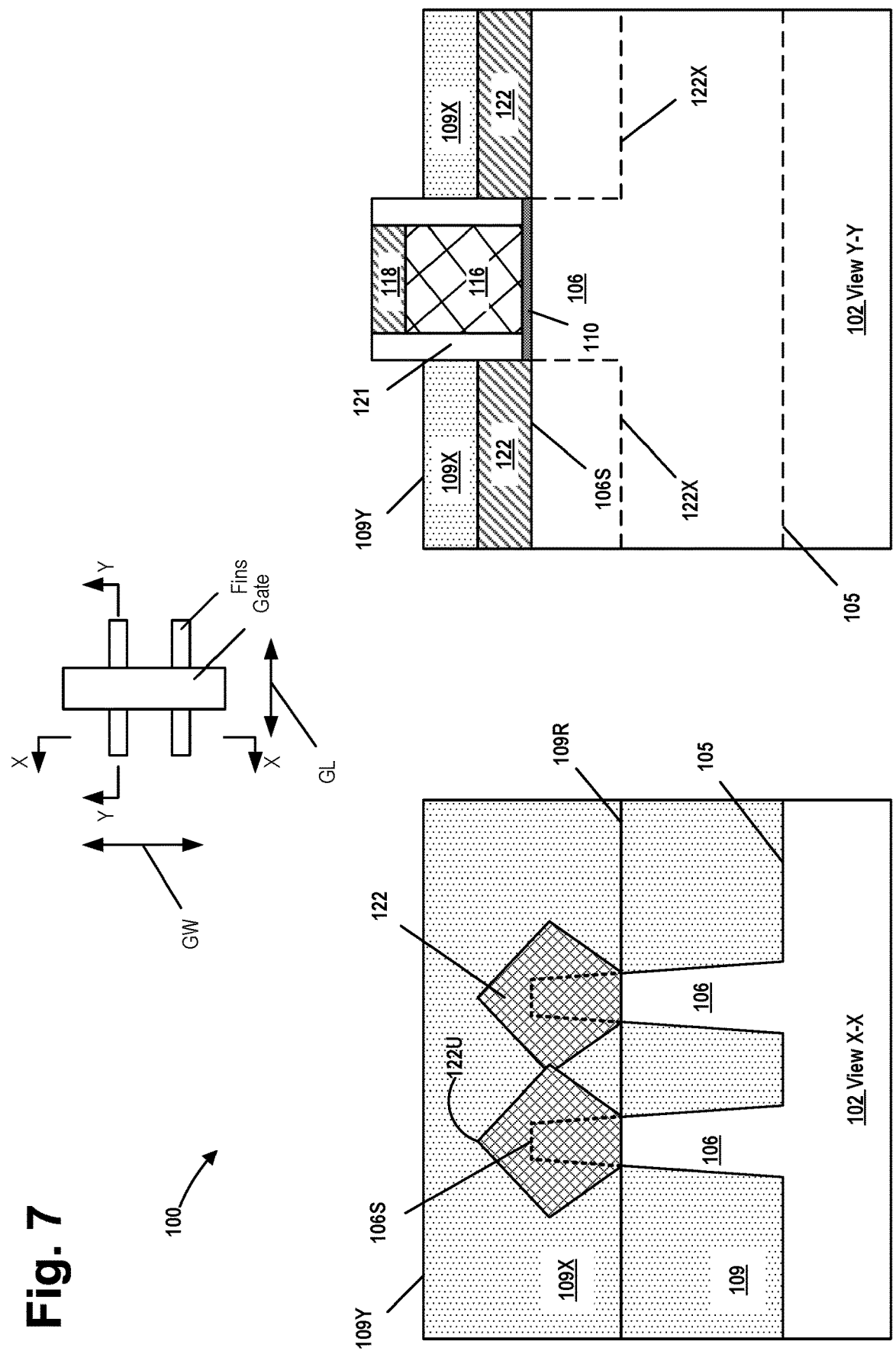

FIG. 7 depicts the FinFET device 100 after a second layer of insulating material 109X was formed above the first layer of insulating material 109. In the example shown in the drawings, the second layer of insulating material 109X was formed on and in contact with the upper surface 109R of the first recessed layer of insulating material 109. As depicted, the second layer of insulating material 109X is formed such that its upper surface 109Y is positioned at a level that is above the level of the upper surface 122U of the epi semiconductor material 122. The second layer of insulating material 109X may be comprised of any insulating material, such as those identified above for the first layer of insulating material 109. However, the first layer of insulating material 109 and the second layer of insulating material 109X need not be made of the same material, but that may be the case in some applications. In some cases, the upper surface 109Y of the second layer of insulating material 109X may be planarized after it is initially deposited.

Figure 8:
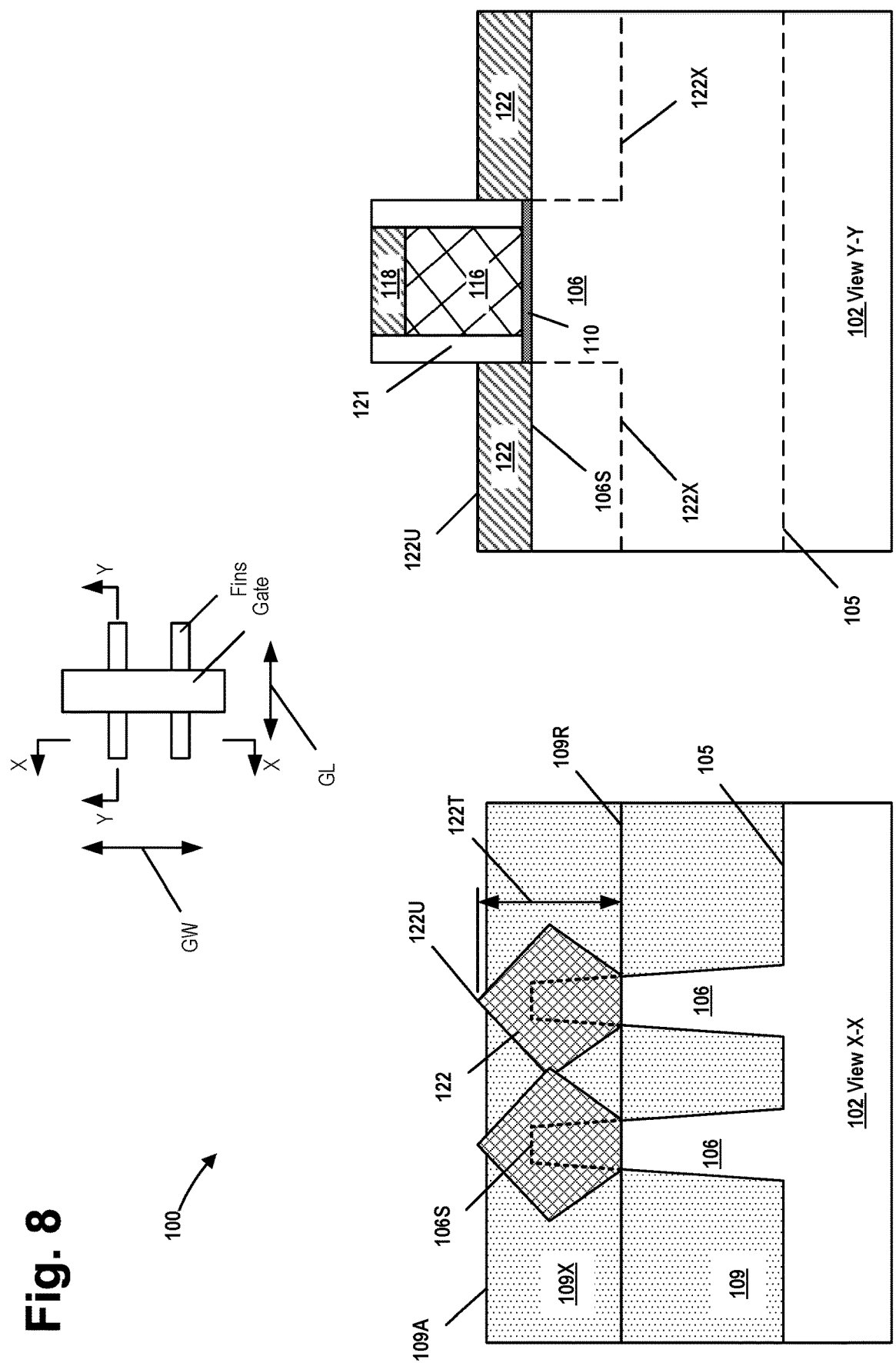
Figure 9:
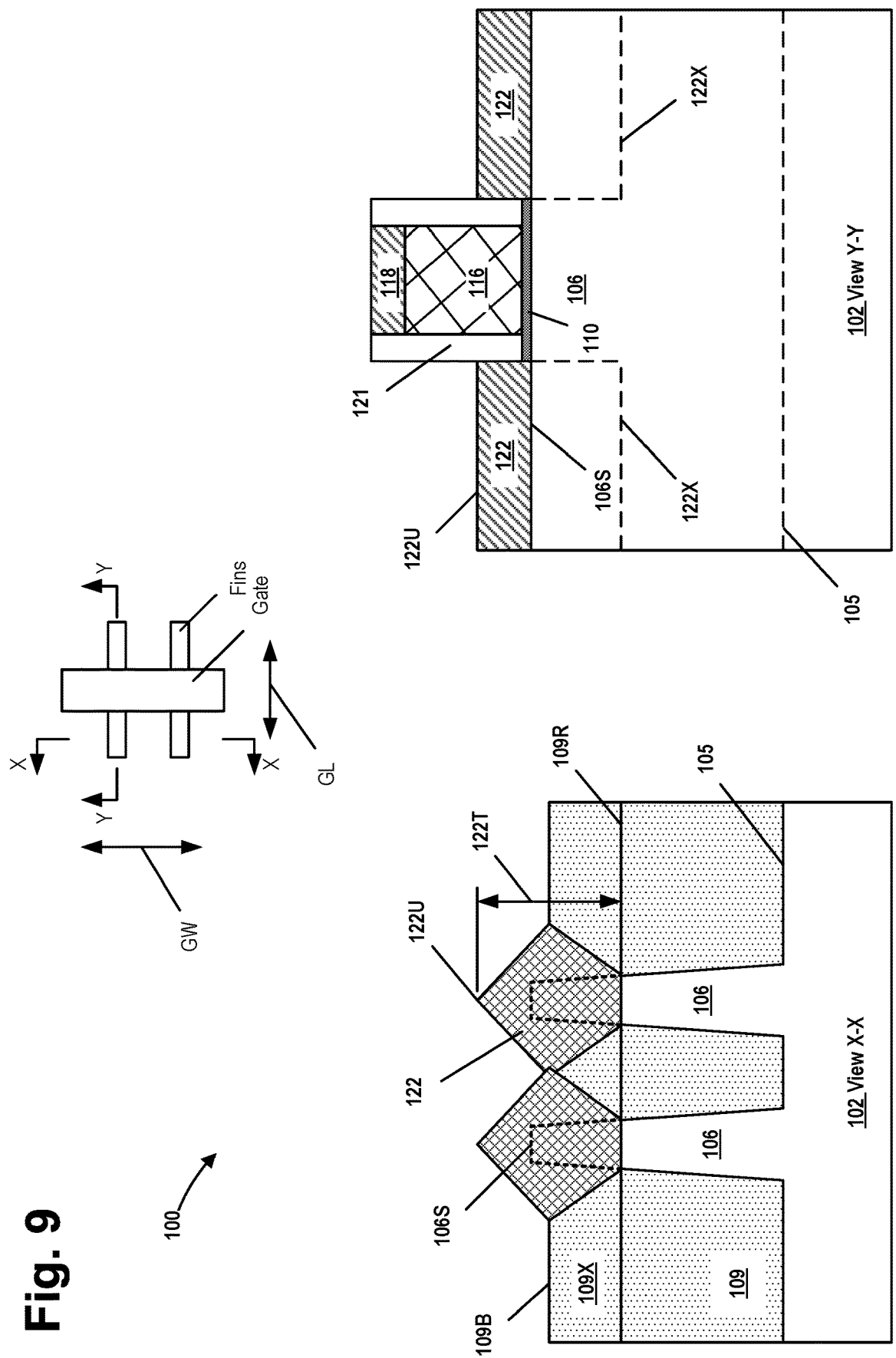

The next major process operation involves performing a recess etching process on the second layer of insulating material 109X so as to expose at least a portion of the epi semiconductor material 122 in the source/drain regions. FIG. 8 depicts one illustrative situation where a timed, recess etching process was performed for a sufficient duration such that the second layer of insulating material 109X has a substantially planar recessed upper surface 109A that exposes just the upper portion of the epi semiconductor material 122, e.g., a minimum amount that is sufficient to form a conductive contact to the epi semiconductor material 122. In one illustrative embodiment, approximately 20-70 nm of the vertical thickness (or height) 122T of the epi semiconductor material 122 may be positioned above a level of the recessed upper surface 109A of the second layer of insulating material 109X. FIG. 9 depicts another illustrative situation where a timed, recess etching process was performed on the second layer of insulating material 109X for a sufficient duration such that the second layer of insulating material 109X has a substantially planar recessed upper surface 109B such that at least approximately 50% of the vertical thickness (or height) 122T of the epi semiconductor material 122 may be positioned above a level of the recessed upper surface 109B of the second layer of insulating material 109X. Of course, the second layer of insulating material 109X may be recessed to any position between the positions shown in FIGS. 8 and 9.

Figure 10:
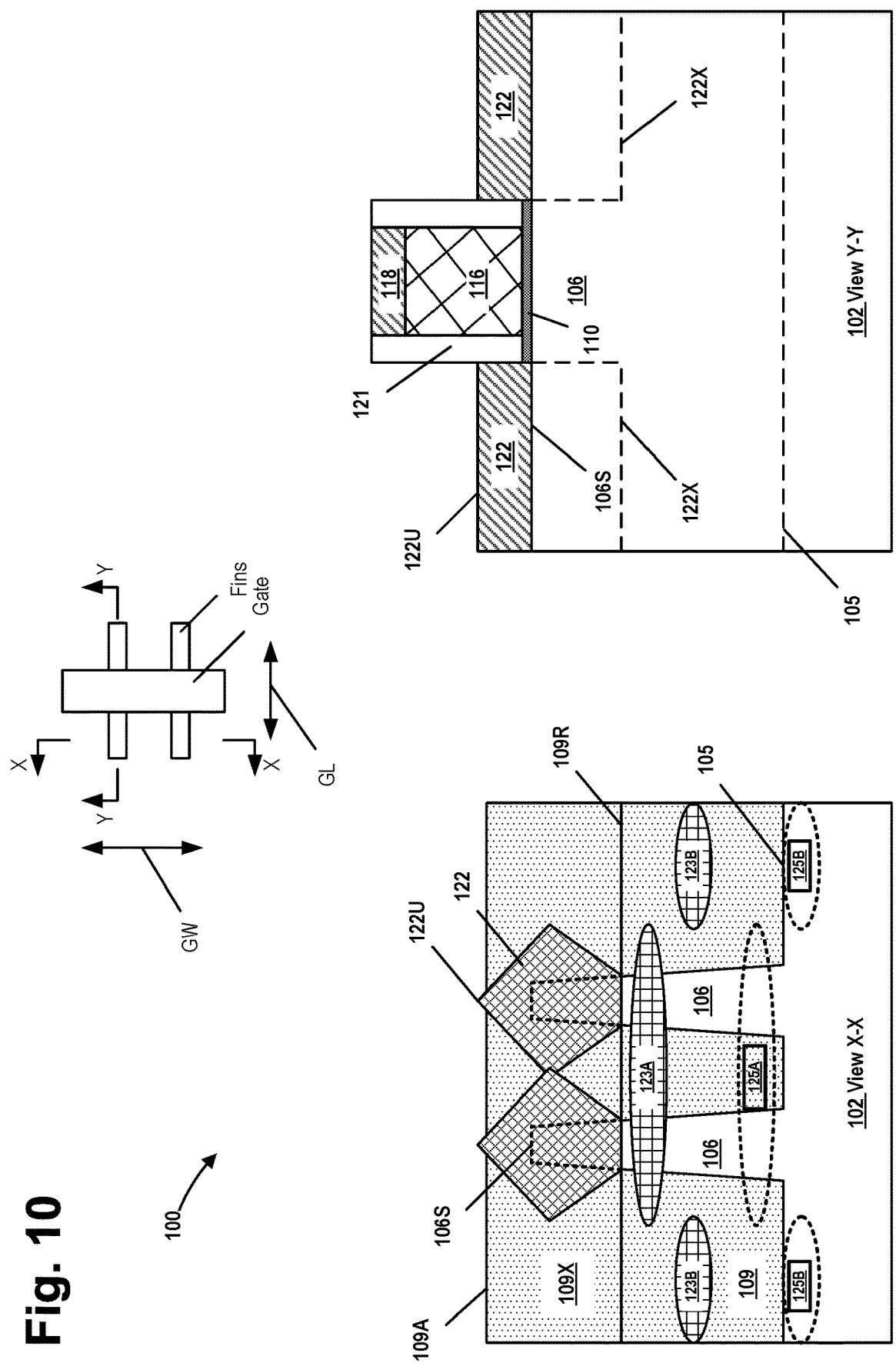
Figure 11:
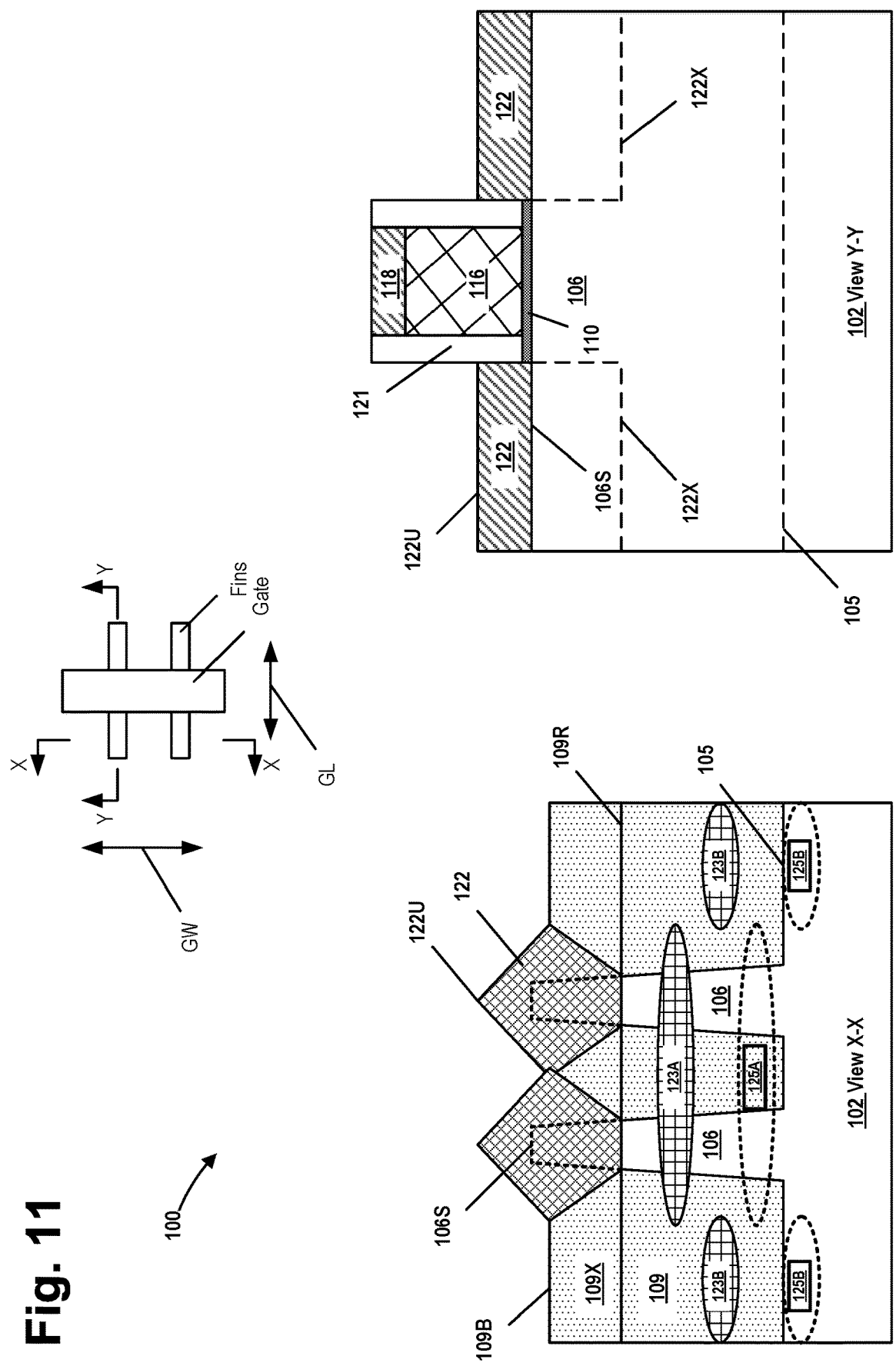

The next major process operation involves performing an ion implantation process to form simplistically-depicted doped regions 123A, 123B (collectively referenced using the numeral 123) in the source/drain regions below the upper surface 109R of the first layer of insulating material 109. With reference to FIGS. 10 and 11, the doped regions 123 simplistically depict the approximate locations of the peak concentration of dopant atoms within the regions 123A, 123B. As depicted, the doped regions 123B are positioned further below the upper surface 109R of the first layer of insulating material 109 than the doped region 123A. This ion implantation process also introduces dopant material into the epi semiconductor material 122. For an N-type FinFET device 100, the doped regions 123 will be doped with an N-type dopant. Conversely, for a P-type FinFET device 100, the doped regions 123 will be doped with a P-type dopant. The concentration of dopant atoms within the doped regions 123 may vary depending upon the particular application, e.g., $1e^{19}$-$5e^{21}$ atoms/cm$^3$.

With reference to FIGS. 8 and 10, due to the recessed second layer of insulating material 109X, the doped regions 123 are positioned shallower within the recessed first layer of insulating material 109 as compared to prior art processes wherein the second layer of insulating material 109X is not present and the ion implantation process is performed with only the recessed first layer of insulating material 109 in position. In this latter prior art situation, the prior art doped regions 125A, 125B (indicated by dashed lines) would be formed significantly deeper in the device 100. In absolute terms, in the illustrative embodiment shown in FIG. 10, where the recessed second layer of insulating material 109X is only recessed to expose the upper portion 122U of the epi semiconductor material 122, the location of peak dopant concentration of the doped region 123A may be about 0-150 nm below the upper surface 109R of the first layer of insulating material 109, and the location of peak dopant concentration of the doped regions 123B may be about 0-150 nm below the upper surface 109R of the first layer of insulating material 109.

With reference to FIGS. 9 and 11, as before, due to the recessed second layer of insulating material 109X, the doped regions 123 are positioned shallower within the first layer of insulating material 109 as compared to prior art processes wherein the recessed second layer of insulating material 109X is not present and the ion implantation process is performed with only the recessed first layer of insulating material 109 in position. That is, the doped regions 123 shown in FIG. 11, will be positioned shallower in the device as compared to their corresponding prior art doped regions 125A, 125B. However, the doped regions 123 shown in FIG. 11 will be positioned deeper in the recessed first layer of insulating material 109 as compared to the doped regions 123 shown in FIG. 10, due to the fact that the recessed second layer of insulating material 109X in FIG. 11 (with the recessed upper surface 109B) is thinner than the recessed second layer of insulating material 109X in FIG. 10 (with the recessed upper surface 109A). In absolute terms, in the illustrative embodiment shown in FIG. 11, the location of peak dopant concentration of the doped region 123A may be about 0-150 nm below the upper surface 109R of the first layer of insulating material 109, and the location of peak dopant concentration of the doped regions 123B may be about 20-170 nm below the upper surface 109R of the first layer of insulating material 109.

Figure 12:
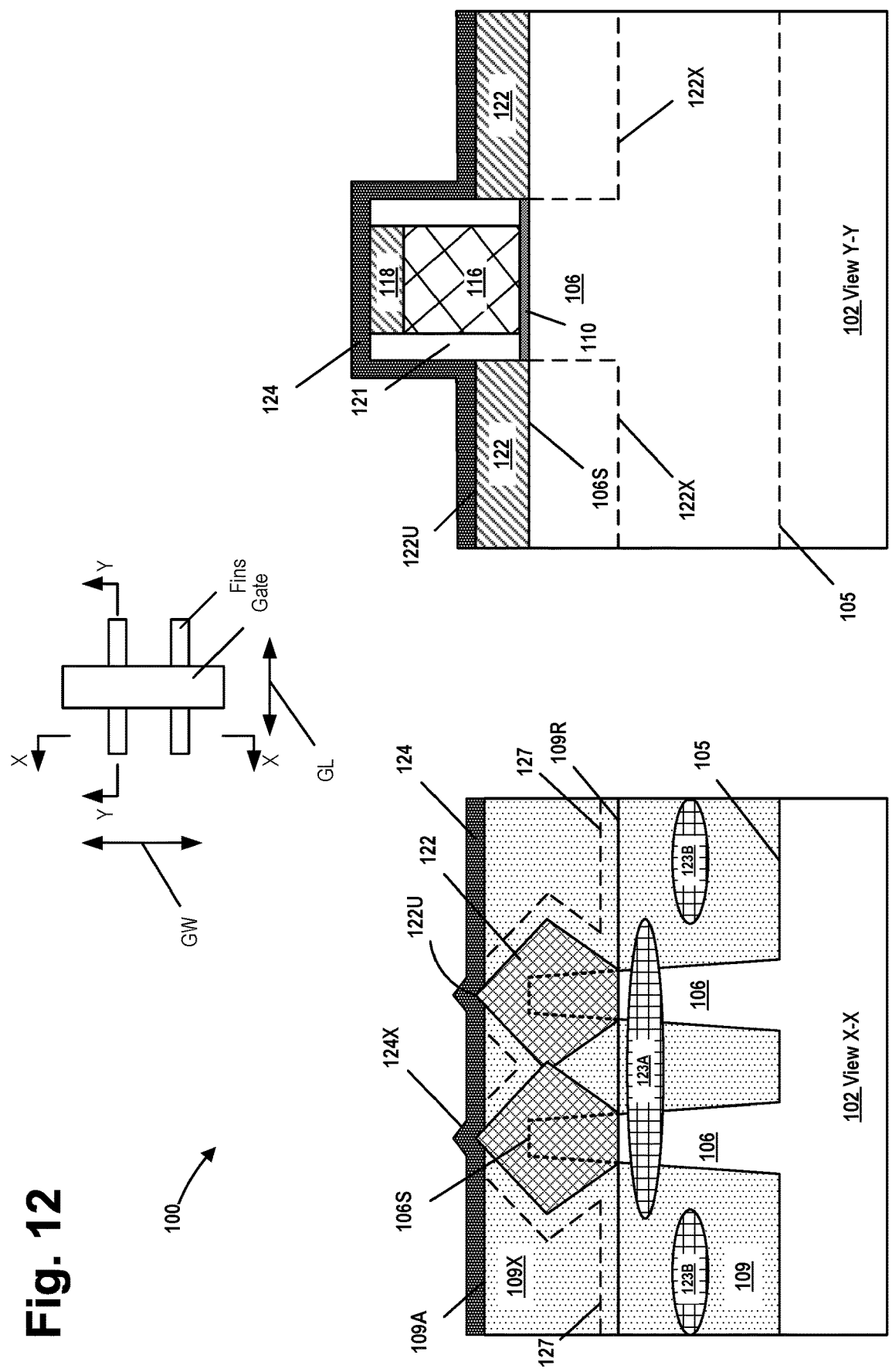
Figure 13:
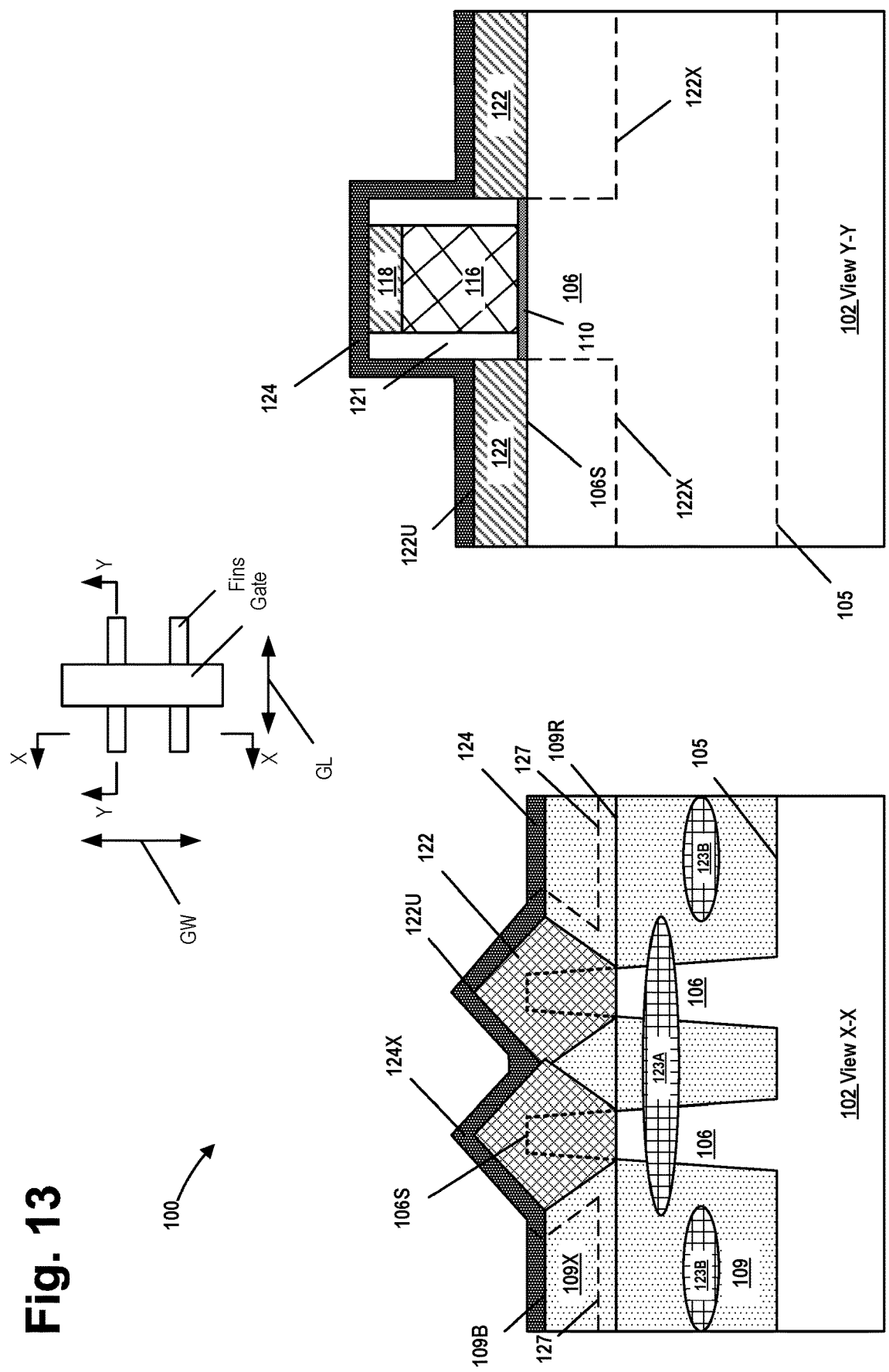

With reference to FIGS. 12 and 13, the next major process operation involves performing a conformal deposition process to form a conformal etch-stop layer 124 on the FinFET device 100. The conformal etch-stop layer 124 may be comprised of a variety of different materials, e.g., silicon nitride, a low-k material, etc., and it may be formed to any desired thickness. In the depicted examples, the conformal etch-stop layer 124 is formed on and in contact with the recessed upper surface (109A or 109B depending upon the situation) of the recessed second layer of insulating material 109X.

In the embodiment shown in FIG. 12, due to the presence of the recessed second layer of insulating material 109X (with the recessed upper surface 109A that only exposes a minimal amount of the epi semiconductor material 122), the portion of the conformal etch-stop layer 124 in the source/drain region has a substantially planar configuration except for the upset regions 124X formed above the uppermost surface 122U of the epi semiconductor material 122. In contrast, the embodiment shown in FIG. 13, due to the presence of the relatively thinner recessed second layer of insulating material 109X (with the recessed upper surface 109B that exposes as much as about approximately 50% of the vertical thickness 122T of the epi semiconductor material 122), the portion of the conformal etch-stop layer 124 in the source/drain region is substantially more conformal than the one shown in FIG. 12, as a portion of the conformal etch-stop layer 124 wraps around approximately the upper half of the epi semiconductor material 122. However, as will be appreciated by those skilled in the art after a complete reading of the present application, both of the conformal etch-stop layers 124 shown in FIGS. 12 and 13 are much less conformal than a corresponding conformal etch-stop layer formed in situations where the second layer of insulating material 109X is omitted. For example, the dashed line 127 in FIGS. 12 and 13 depicts the highly conformal configuration of a portion of a conformal etch-stop layer that would be formed if the second layer of insulating material 109X was not present.

Figure 14:
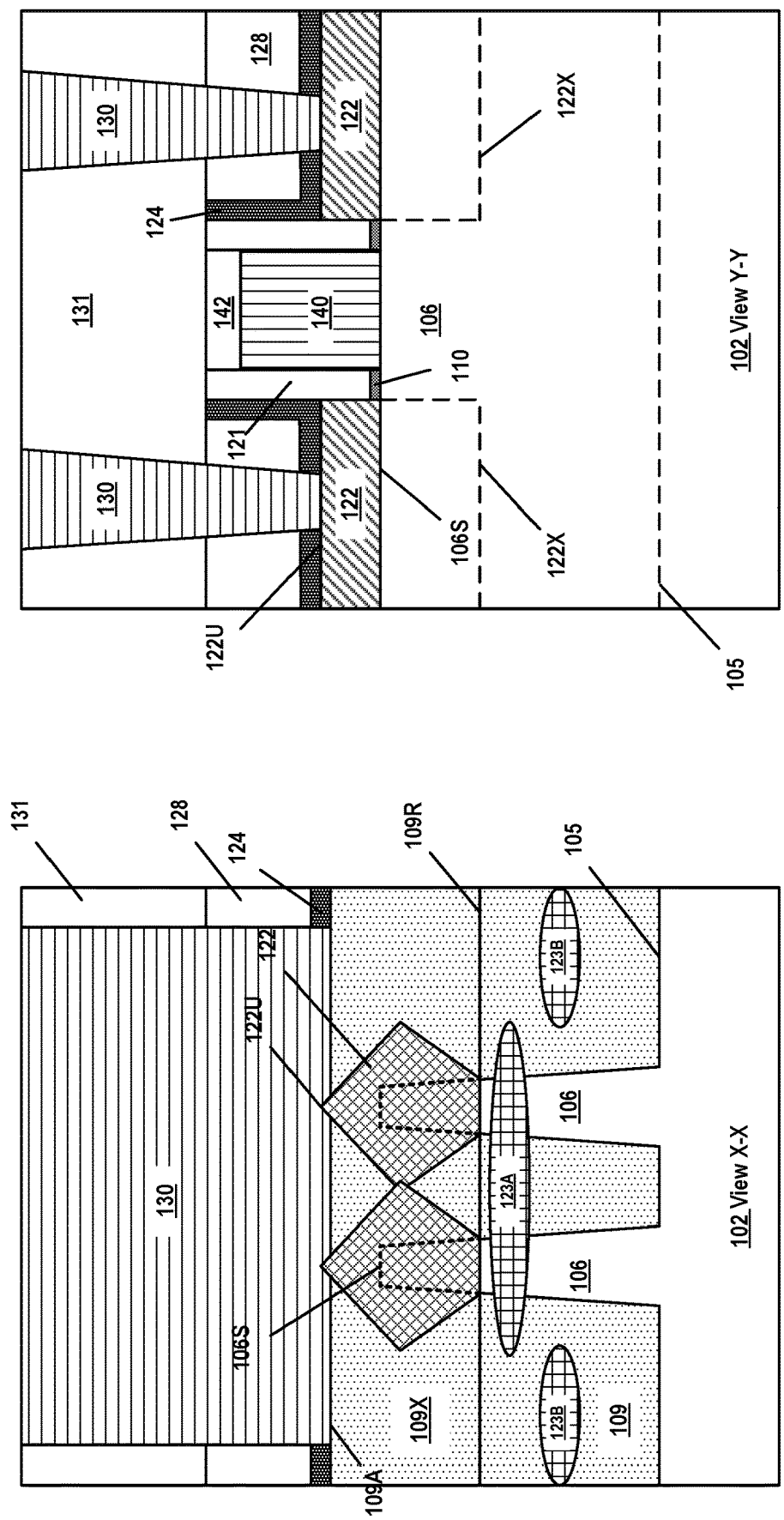

At the point of processing depicted in FIGS. 12 and 13, traditional manufacturing operations (described briefly below) may be performed to complete the manufacture of the FinFET device 100. Accordingly, FIGS. 14 and 15 depict the FinFET device 100 after several process operations were performed. The embodiment shown in FIG. 14 has the relatively thicker recessed second layer of insulating material 109X (with the recessed upper surface 109A), while the embodiment shown in FIG. 15 has the relatively thinner recessed second layer of insulating material 109X (with the recessed upper surface 109B). First, a layer of insulating material 128 was formed on the device 100. Thereafter, a CMP process was performed to remove the gate cap 118 thereby exposing the sacrificial gate structure 116. Then, using traditional replacement-gate manufacturing techniques, the sacrificial gate structure 116 and the sacrificial gate insulation layer 110 were removed and a simplistically depicted final replacement gate structure 140 comprised of a high-k (k value of 10 or greater) gate insulation layer (not separately shown) and conductive materials (not separately shown) i.e., one or more metal layers and/or polysilicon was formed in its place. Thereafter, the replacement gate materials were recessed and a final gate cap 142 was formed above the replacement gate structure 140. Next, additional insulating material 131 (e.g., silicon dioxide) was formed above the device 100 and above the source/drain regions. At that point, various masking and etching processes were performed through the layers of insulating material 131, 128 and the contact etch-stop layer 124 so as to define contact openings that expose the epi semiconductor material 122 in the source/drain regions that is positioned above the recessed second layer of insulating material 109X. At that point, if desired, a metal silicide material (not shown) may be formed on the exposed portions of the epi semiconductor material 122. Thereafter, illustrative source/drain contact structures 130 were formed in contact openings defined in the insulating materials 131, 128 and the conformal etch stop layer 124 so as to conductively contact the epi semiconductor material 122 in the source/drain regions of the device 100. In the depicted example, the source/drain contact structures 130 are line-type structures that span across both of the fins (in the gate width direction of the device). See view X-X. In other cases, the source/drain contact structures 130 may be individual point-type contacts having a generally cylindrical or rectangular configuration (when viewed from above). The source/drain contact structures 130 may be made of any desired material, e.g., tungsten.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A method of forming source/drain regions on a FinFET device, the method comprising:
    forming at least one fin in a semiconductor substrate;
    forming a first recessed layer of insulating material adjacent the at least one fin, the first recessed layer of insulating material having a first upper surface, wherein a portion of the at least one fin is positioned above the first upper surface;
    forming epi semiconductor material on the portion of the at least one fin positioned above the first upper surface;
    forming a second recessed layer of insulating material above the first recessed layer of insulating material, the second recessed layer of insulating material having a second upper surface, wherein at least a portion of the epi semiconductor material is positioned above a level of the second upper surface, and wherein the second recessed layer of insulating material is formed on and in physical contact with the first upper surface of the first recessed layer of insulating material; and
    forming a source/drain contact structure above the second recessed layer of insulating material, the source/drain contact structure being conductively coupled to the epi semiconductor material.

2. The method of claim 1, wherein the first recessed layer of insulating material and the second recessed layer of insulating material are made of a same insulating material.

3. The method of claim 2, wherein the first upper surface is a substantially planar first upper surface and the second upper surface is a substantially planar second upper surface.

4. The method of claim 1, further comprising forming a conformal etch stop layer above the second upper surface and above the portion of the epi semiconductor material positioned above the level of the second upper surface.

5. The method of claim 4, wherein the conformal etch stop layer is formed on and in physical contact with the second upper surface.

6. The method of claim 4, wherein the conformal etch stop layer is formed on and in physical contact with the portion of the epi semiconductor material positioned above the level of the second upper surface.

7. The method of claim 4, wherein, prior to forming the conductive source/drain contact structure, the method comprises removing a portion of the conformal etch-stop layer so as to form a contact opening for the conductive source/drain contact structure.

8. The method of claim 4, wherein the conformal etch stop layer has a substantially planar upper surface.

9. The method of claim 1, wherein the epi semiconductor material has a vertical thickness and wherein, at most, 50% of the vertical thickness of the epi semiconductor material is positioned above the level of the second upper surface.

10. The method of claim 1, wherein forming at least one fin in the semiconductor substrate comprises forming at least first and second fins in the semiconductor substrate, wherein forming the epi semiconductor material on the at least one fin comprises forming first and second regions of the epi semiconductor material on the first and second fins, respectively, wherein the first and second regions of epi semiconductor material contact one another.

11. The method of claim 1, wherein:
forming the first recessed layer of insulating material comprises:
depositing the first layer of insulating material such that it covers an upper surface of the at least one fin; and
performing a first recess etching process on the first layer of insulating material to remove a portion of the first layer of insulting material and thereby form the first recessed layer of insulating material with the first upper surface; and
wherein forming the second recessed layer of insulating material comprises:
depositing the second layer of insulating material on and in physical contact with the first upper surface, the second layer of insulating material being deposited such that it covers an upper surface of the epi semiconductor material; and
performing a second recess etching process on the second layer of insulating material to remove a portion of the second layer of insulating material and thereby form the second recessed layer of insulating material with the second upper surface.

12. A method of forming source/drain regions on a FinFET device, the method comprising:
forming at least one fin in a semiconductor substrate;
forming a first recessed layer of insulating material adjacent the at least one fin, the first recessed layer of insulating material having a substantially planar first upper surface, wherein a portion of the at least one fin is positioned above the substantially planar first upper surface;
forming epi semiconductor material on the portion of the at least one fin positioned above the first substantially planar upper surface, wherein the epi semiconductor material has a vertical thickness;
forming a second recessed layer of insulating material above the substantially planar first upper surface of the first recessed layer of insulating material, the second recessed layer of insulating material having a substantially planar second upper surface, wherein at least a portion, but at most 50% of the vertical thickness of the epi semiconductor material is positioned above a level of the substantially planar second upper surface, and wherein the second layer of insulating material is positioned on and in physical contact with the substantially planar first upper surface of the first layer of insulating material; and
forming a source/drain contact structure above the second recessed layer of insulating material, the source/drain contact structure being conductively coupled to the epi semiconductor material.

13. The method of claim 12, further comprising forming a conformal etch stop layer on and in physical contact with the substantially planar second upper surface and above the portion of the epi semiconductor material positioned above the level of the second upper surface.

14. The method of claim 13, wherein the conformal etch stop layer is formed on and in physical contact with the portion of the epi semiconductor material positioned above the level of the second upper surface.

15. The method of claim 13, wherein the conformal etch stop layer has a substantially planar upper surface.

16. A FinFET device, comprising:
at least one fin;
a first layer of insulating material positioned adjacent the at least one fin, the first layer of insulating material having a substantially planar first upper surface, wherein a portion of the at least one fin is positioned above the substantially planar first upper surface;
an epi semiconductor material positioned on the portion of the at least one fin positioned above the substantially planar first upper surface, wherein the epi semiconductor material has a vertical thickness;
a second layer of insulating material positioned above the substantially planar first upper surface, the second layer of insulating material having a substantially planar second upper surface, wherein at least a portion, but at most approximately 50% of the vertical thickness of the epi semiconductor material is positioned above a level of the substantially planar second upper surface, and wherein the second layer of insulating material is positioned on and in physical contact with the substantially planar first upper surface of the first layer of insulating material; and
a source/drain contact structure positioned above the substantially planar second upper surface, the source/drain contact structure being conductively coupled to the epi semiconductor material.

17. The FinFET device of claim 16, further comprising a conformal etch stop layer positioned on and in physical contact with the substantially planar second upper surface and positioned above the portion of the epi semiconductor material positioned above the level of the substantially planar second upper surface.

18. The FinFET device of claim 17, wherein the conformal etch stop layer has a substantially planar upper surface.

* * * * *